US007176067B2

(12) United States Patent
Jung et al.

(10) Patent No.: US 7,176,067 B2
(45) Date of Patent: Feb. 13, 2007

(54) METHODS OF FABRICATING FIN FIELD EFFECT TRANSISTORS

(75) Inventors: In-Soo Jung, Gyeonggi-do (KR);
Deok-Hyung Lee, Gyeonggi-do (KR);
Si-Young Choi, Gyeonggi-do (KR);
Byeong-Chan Lee, Gyeonggi-do (KR);
Yong-Hoon Son, Gyeonggi-do (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 10/869,763

(22) Filed: Jun. 16, 2004

(65) Prior Publication Data
US 2004/0262687 A1 Dec. 30, 2004

(30) Foreign Application Priority Data
Jun. 27, 2003 (KR) .............. 10-2003-0042736

(51) Int. Cl.
*H01L 21/339* (2006.01)

(52) U.S. Cl. ............... 438/144; 438/149; 257/E21.411; 257/E21.415; 257/E21.442

(58) Field of Classification Search ............... 438/144, 438/157; 257/E21.411, E21.415, E21.442
See application file for complete search history.

(56) References Cited

U.S. PATENT DOCUMENTS

| 6,403,434 | B1 * | 6/2002 | Yu | 438/300 |
| 6,689,650 | B2 * | 2/2004 | Gambino et al. | 438/157 |
| 6,756,277 | B1 * | 6/2004 | Yu | 438/300 |
| 6,762,483 | B1 * | 7/2004 | Krivokapic et al. | 257/618 |
| 6,764,884 | B1 * | 7/2004 | Yu et al. | 438/157 |
| 6,885,055 | B2 * | 4/2005 | Lee | 257/308 |
| 2003/0011018 | A1 * | 1/2003 | Hurley | 257/314 |
| 2004/0007738 | A1 * | 1/2004 | Fried et al. | 257/329 |
| 2004/0145000 | A1 * | 7/2004 | An et al. | 257/270 |
| 2005/0057964 | A1 * | 3/2005 | Mathew et al. | 365/177 |

FOREIGN PATENT DOCUMENTS

KR 1020020083768 11/2002

OTHER PUBLICATIONS

Wolf and Tauber; Silicon Processing for the VLSI Era vol. 1: Process Technology; pp. 133-137 and 168; Lattice Press; 1986; Sunset Beach, CA.*
Huang et al., "Sub 50-nm FinFET: PMOS," 1999 IEEE International Electron Device Meeting Technical Digest.
Lyu et al., Lateral Channel Doping Engineering in 0.1 μm Recessed Channel nMOSFETs, Inter-University Semiconductor Research Center, Seoul National University.

* cited by examiner

*Primary Examiner*—Michelle Estrada
*Assistant Examiner*—Fernando L. Toledo
(74) *Attorney, Agent, or Firm*—Myers Bigel Sibley & Sajovec, PA

(57) ABSTRACT

A method of forming a fin field effect transistor on a semiconductor substrate includes forming an active region in the substrate, forming an epitaxial layer on the active region, and removing a portion of the epitaxial layer to form a vertical fin on the active region. The fin has a width that is narrower than a width of the active region. Removing a portion of the epitaxial layer may include oxidizing a surface of the epitaxial layer and then removing the oxidized surface of the epitaxial layer to decrease the width of the fin. The epitaxial layer may be doped in situ before removing a portion of the epitaxial layer. The method further includes forming a conductive layer on a top surface and on sidewalls of the fin. Related transistors are also discussed.

24 Claims, 7 Drawing Sheets

METHODS OF FABRICATING FIN FIELD EFFECT TRANSISTORS

CLAIM OF PRIORITY

This application claims priority from Korean Patent Application No. 10-2003-42736, filed on Jun. 27, 2003, the disclosure of which is hereby incorporated herein by reference.

BACKGROUND OF THE INVENTION

1. Field of the Invention

The present invention relates to semiconductor devices, and, more particularly, to field effect transistors and fabrication methods thereof.

2. Description of the Related Art

Metal-oxide semiconductor field effect transistors (MOSFETs) may be scaled-down (i.e. reduced in size) in order to improve transistor properties and integration. For next-generation transistors, it may be essential to effectively suppress short channel effects in order to achieve channel lengths below 50 nm. In recent years, many approaches to reduce gate electrode length down to 20~30 nm have been researched and studied. However, due to the short channel length between the source region and the drain region, efforts to suppress short channel effects have been rather unsuccessful thus far.

As such, it may be difficult to achieve stable performance with conventional (flat type) transistors as transistor size is decreased. Research has shown that double-gate field effect transistors may be good substitutes for conventional flat type transistors. Double-gate field effect transistors have gates positioned on both sides of a thin channel, so that the channel voltage may be more effectively controlled.

A fin field effect transistor (FinFET), which is a type of double-gate field effect transistor, is described by Huang et al. in "Sub 50-nm FinFET: PMOS", 1999 IEEE International Electron Device Meeting Technical Digest.

As disclosed above, a FinFET may include a fin on a SOI (silicon on insulator) substrate that serves as a channel. A source and a drain may be formed on opposite ends of the fin, and a gate therebetween may separate the source and the drain. The FinFET may be used with and/or substituted for conventional flat type transistors.

Channel doping may be necessary for the application of FinFETs for use in dynamic memory (DRAM), which can require refreshing. Doping of the fin with impurities may result in increased threshold voltage but also may result in decreased subthreshold swing, which may improve transistor on/off characteristics. On the other hand, non-homogeneous doping of the fin may reduce subthreshold swing properties but may also reduce threshold voltage, which may reduce the ratio of on-current to off-current such that on/off performance of the memory device is also degraded. If channel doping is not performed at all, the threshold voltage may be reduced. With either alternative (i.e. where no channel doping or non-homogenous doping is used), threshold voltage variation and off-state leakage current may be increased. As such, FinFET performance may be degraded.

SUMMARY OF THE INVENTION

In various embodiments of the present invention, a method of forming a fin field effect transistor on a semiconductor substrate includes forming an active region in the substrate, forming an epitaxial layer on the active region, and then removing a portion of the epitaxial layer to form a vertical fin on the active region. The fin has a narrower width than the width of the active region. The method also includes forming a conductive layer on a top surface and on sidewalls of the fin.

According to further embodiments of the present invention, forming a conductive layer can include forming a conductive layer on a majority of the sidewalls of the fin and/or forming a conductive layer substantially covering the sidewalls of the fin.

In other embodiments of the present invention, removing a portion of the epitaxial layer may include oxidizing a surface of the epitaxial layer and then removing the oxidized surface of the epitaxial layer to decrease the width of the fin. The epitaxial layer may be doped in situ before removing a portion of the epitaxial layer.

According to still further embodiments, forming an active region may include forming a trench in the substrate, forming an oxide layer on a bottom surface and on sidewalls of the trench, forming a nitride liner on a bottom surface and on sidewalls of the trench, and forming an isolation layer in the trench to define the active region adjacent the trench. The method may further include recessing the active region before forming the epitaxial layer.

In yet other embodiments according to the present invention, a fin field effect transistor includes an active region in a semiconductor substrate and a vertical fin on the active region. The fin is an epitaxial layer having a width narrower than a width of the active region. The transistor further includes a conductive layer on a top surface and sidewalls of the fin.

According to further embodiments of the present invention, the transistor may include a trench in the substrate adjacent the active region and an isolation layer in the trench. The isolation layer may fill the trench adjacent the active region. The transistor may further include an oxide layer on a bottom surface and on sidewalls of the trench and a nitride liner on a bottom surface and on sidewalls of the trench. The oxide layer and the nitride liner may be positioned between the isolation layer and the active region. The isolation layer may protrude above the surface of the substrate to a height about the same as the height of the fin.

Accordingly, various embodiments of the present invention provide a fin field effect transistor with a scaled-down fin that is narrower in width than that which may be achieved with known techniques. To account for short-channel effects from the decreased fin size, the fin is homogenously doped in situ such that threshold voltage is increased, off-state leakage current is reduced, and variations in threshold voltage are reduced.

DETAILED DESCRIPTION OF THE INVENTION

Figure 1:
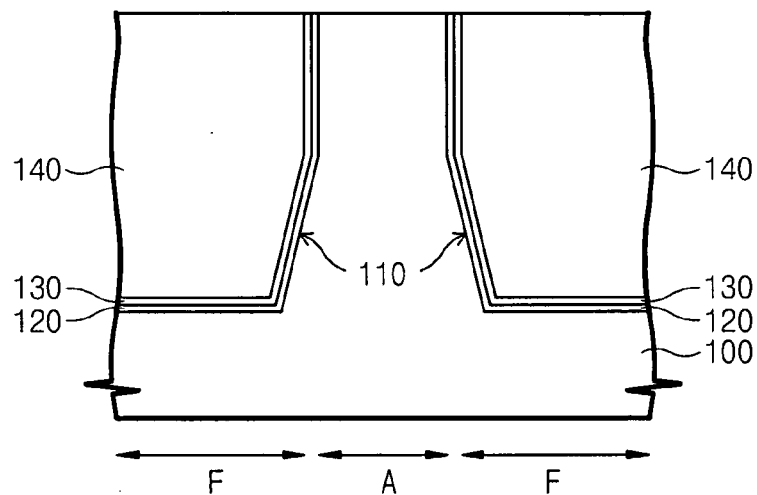
FIG. 1–FIG. 6 are cross-sectional views illustrating methods of fabricating fin field effect transistors according to various embodiments of the present invention.

The present invention now will be described more fully hereinafter with reference to the accompanying drawings, in which preferred embodiments of the invention are shown. This invention may, however, be embodied in many different forms and should not be construed as limited to the embodiments set forth herein; rather, these embodiments are provided so that this disclosure will be thorough and complete, and will fully convey the scope of the invention to those skilled in the art. In the drawings, the thickness of layers and regions are exaggerated for clarity. It will be understood that when an element such as a layer, region or substrate is referred to as being "on" another element, it can be directly on the other element or intervening elements may also be present. It will be understood that when an element such as a layer, region or substrate is referred to as "under" another element, it can be directly under the other element or intervening elements may also be present. It will also be understood that the term "and/or" as used herein refers to and encompasses any and all possible combinations of one or more of the associated listed items.

Furthermore, relative terms such as beneath may be used herein to describe one layer or region's relationship to another layer or region as illustrated in the Figures. It will be understood that these terms are intended to encompass different orientations of the device in addition to the orientation depicted in the Figures. For example, if the device in the Figures is turned over, layers or regions described as "beneath" other layers or regions would now be oriented "above" these other layers or regions. The term "beneath" is intended to encompass both above and beneath in this situation. Like numbers refer to like elements throughout.

The terminology used in the description of the invention herein is for the purpose of describing particular embodiments only and is not intended to be limiting of the invention. As used in the description of the invention and the appended claims, the singular forms "a", "an" and "the" are intended to include the plural forms as well, unless the context clearly indicates otherwise.

It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Embodiments of the invention are described herein with reference to cross-section illustrations that are schematic illustrations of idealized embodiments (and intermediate structures) of the invention. As such, variations from the shapes of the illustrations as a result, for example, of manufacturing techniques and/or tolerances, are to be expected. Thus, embodiments of the invention should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the invention.

Unless otherwise defined, all terms used in disclosing embodiments of the invention, including technical and scientific terms, have the same meaning as commonly understood by one of ordinary skill in the art to which this invention belongs, and are not necessarily limited to the specific definitions known at the time of the present invention being described. Accordingly, these terms can include equivalent terms that are created after such time. All publications, patent applications, patents, and other references mentioned herein are incorporated by reference in their entirety.

FIG. 1–FIG. 6 are cross-sectional views illustrating methods of fabricating fin field effect transistors according to embodiments of the present invention. FIG. 7 is a perspective view illustrating a fin field effect transistor according to embodiments of the present invention.

Referring to FIG. 1, a fin field effect transistor according to embodiments of the present invention is formed on a silicon substrate 100. The silicon substrate 100 may be a silicon bulk substrate (as shown) or a silicon-on-insulator (SOI) substrate including a buried oxide layer. A trench 110 is formed on a field region F in the silicon substrate 100 using a photoresist and etching process. The trench 110 is then filled with an insulation material, such as SOG (Spin On Glass) or HDP (High Density Plasma) oxide, to form an isolation layer 140. As such, the silicon substrate 100 is divided into an active region A (where a transistor may be formed) and a field region F (filled by the isolation layer 140) which may electrically insulate one active region from another. In forming the trench 110, the etching process may result in the formation of defects in the surface of the silicon substrate 100, such as lattice point defects. As such, it may be preferable to form a sidewall oxide layer 120 on the bottom surface and sidewalls of the trench 110 to cure any lattice point defects.

Still referring to FIG. 1, in forming the isolation layer 140 as described above, oxygen diffusion from the isolation layer 140 to the silicon substrate 100 may result in oxidation of the silicon substrate 100. This oxidation may cause expansion of the silicon substrate 100 and may thereby cause defects, such as dislocation, in the silicon substrate 100. As such, it may be desirable to form a thin nitride liner 130, for example, 50 Å to 100 Å thick, on the bottom surface and sidewalls of the trench 110. The nitride liner 130 may act as an oxygen diffusion barrier to prevent the formation of defects in the silicon substrate 100.

Figure 2:
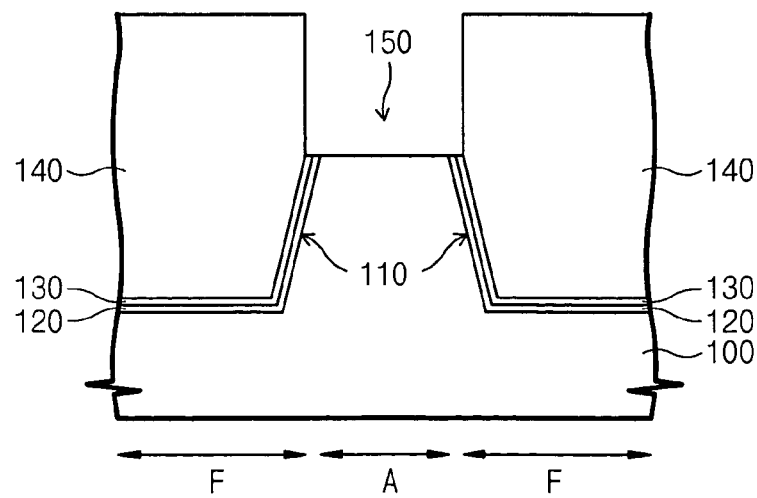

Referring to FIG. 2, the active region A is recessed to form a cavity 150 in the silicon substrate 100 surrounded by the isolation layer 140. A selective silicon etching process may be used to recess the active region A. For example, Thermal Desorption Silicon Etching (TDSE) or Chemical Dry Etching (CDE) using $CF_4$ or $CF_4$ included gas may be used to selectively recess the silicon substrate 100. Other processes for recessing the active region A may also be used to form the cavity 150. If a sidewall oxide layer 120 and a nitride liner 130 are formed within the trench 110, they may be recessed by an oxide-removing process and a nitride-removing process, respectively.

Figure 3:
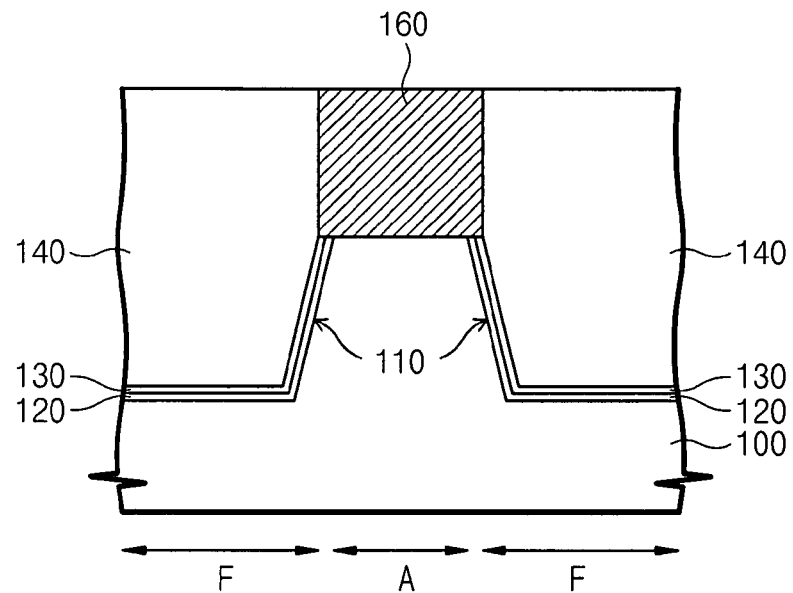

Referring to FIG. 3, an in situ doped silicon epitaxial layer 160 is selectively formed in the cavity 150 on the recessed active region. The epitaxial layer 160 may be formed by a selective epitaxial growth (SEG) process using Ultra High Vacuum Chemical Vaporization Deposition or Low Pressure Chemical Vaporization Deposition. The SEG process may employ at least a silicon source gas, an impurity gas containing a desired impurity for doping, and a selectivity gas.

The selectivity gas may be HCl or $Cl_2$, and may ensure that the in situ doped silicon epitaxial layer 160 is formed on the recessed silicon substrate 100 but not on the isolation layer 140. The silicon source gas may be $SiH_2Cl_2$, $Si_2H_6$, and/or $SiH_4$. The impurity gas may be chosen based on the desired device type. For example, if an N-channel device is desired, a phosphorous gas, such as $PH_3$, may be used as the impurity gas in forming the in situ doped silicon epitaxial layer 160. Alternatively, if a P-channel device is desired, a boron gas, such as $B_2H_6$, may be used as the impurity gas in forming the in situ doped silicon epitaxial layer 160. The doping concentration of the impurity gas may be limited to a particular range, for example, from about $1.0 \times 10^{17}$ to about $1.0 \times 10^{19}$ ions/cm$^3$.

As it may be doped in situ during growth, the epitaxial layer 160 may have a homogenous doping distribution. Therefore, variations in threshold voltage due to impurity nonhomogeneity may be prevented. In addition, degradation of transistor on-off characteristics caused by increases in subthreshold swing may also be reduced and/or eliminated.

Figure 4:
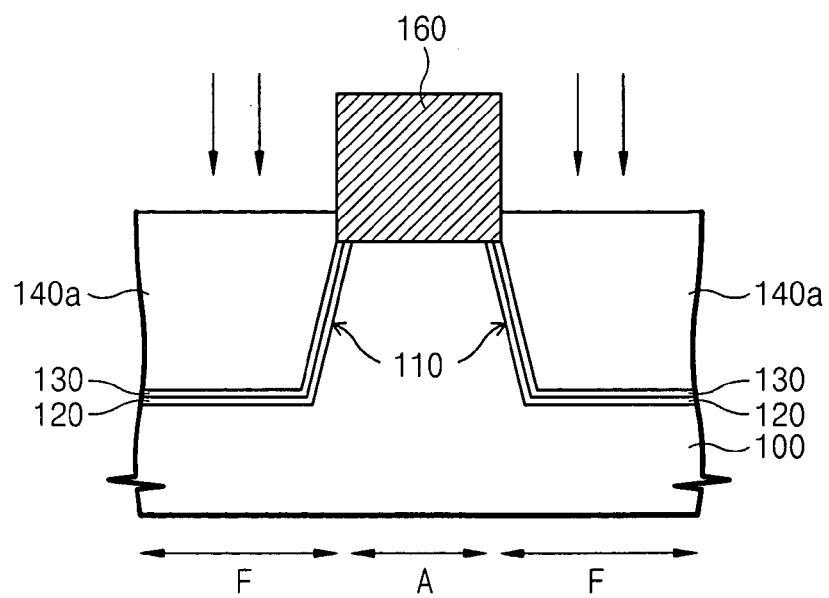

Referring to FIG. 4, a portion of the isolation layer 140 is recessed by an oxide-removing process to form a recessed isolation layer 140a. The oxide-removing process may employ wet etching using HF, although other oxide-removing processes may also be used.

However, the recessed isolation layer 140a may be further recessed by the trimming process described below. As such, a reduced isolation layer 140b (FIG. 5) may be formed below the surface of the silicon substrate 100, which may result in an uneven substrate surface. To avoid this, the recessed isolation layer 140a may formed to a height greater than that of the silicon substrate 100, such that the reduced isolation layer 140b and the substrate 100 may be approximately the same height after the trimming process.

Figure 5:
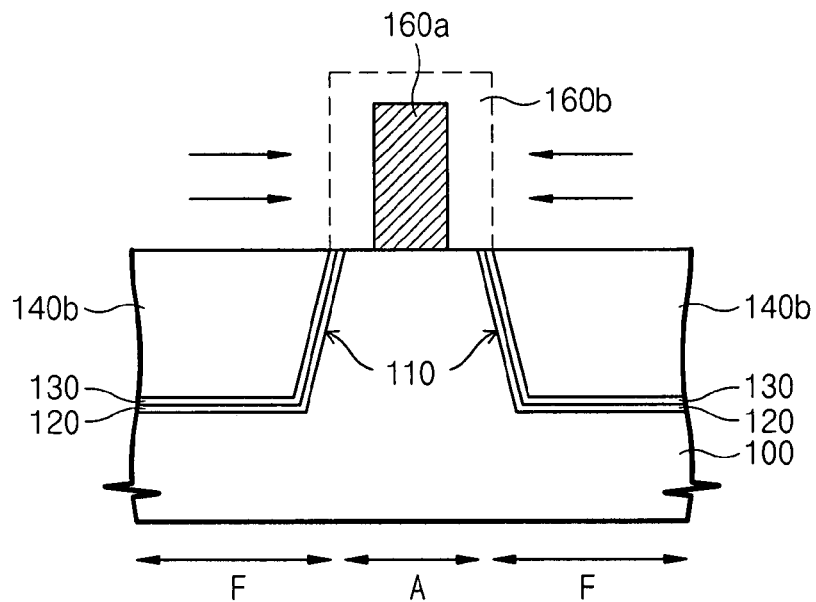

Referring to FIG. 5, the in situ doped silicon epitaxial layer 160 is "trimmed" to form a scaled-down (e.g. 300~500 Å in width) in situ doped silicon epitaxial fin 160a. In other words, a surface portion of the epitaxial layer 160 is removed to form a fin 160a having a reduced width and/or height. During the SEG process, stacking faults may be induced at the interface between the in situ doped silicon epitaxial layer 160 and the isolation layer 140. As such, the surface of the in situ doped silicon epitaxial layer 160 may be oxidized, forming an oxidized surface portion 160b. The oxidized surface portion 160b of the in situ doped silicon epitaxial layer 160 may then be removed to form the scaled-down in situ doped silicon epitaxial fin 160a. Wet etching using HF may be used to remove the oxidized in situ doped silicon epitaxial layer 160b.

As discussed above, the trimming process may involve oxidizing the surface of the in situ doped silicon epitaxial layer 160 and then removing the oxidized surface portion 160b. As a result, a part of the isolation layer 140a may also be removed along with the oxidized surface portion 160b. Therefore, as part of the trimming process, a portion of the recessed isolation layer 140a is removed to form a reduced isolation layer 140b. The height of the reduced isolation layer 140b may be approximately the same as that of the silicon substrate 100. The trimming process may also provide the in situ doped silicon epitaxial fin 160a with a height of about 800 Å to about 900 Å, and a width of about 300 Å to about 500 Å. The width of the epitaxial fin 160a is narrower than the width of the active region A of the substrate 100.

Thus, the trimming process of the present invention may provide a narrower fin than is possible with other known techniques, and may cure stacking faults as well. In other known techniques, the width of the in situ doped silicon epitaxial layer 160 may not be reduced beyond a certain size due to photolithography limitations. However, the trimming process according to embodiments of the present invention may form a scaled-down (e.g. 300~500 Å wide) in situ doped silicon epitaxial fin 160a, which may be beyond that which may be achieved by photolithography.

Figure 6:
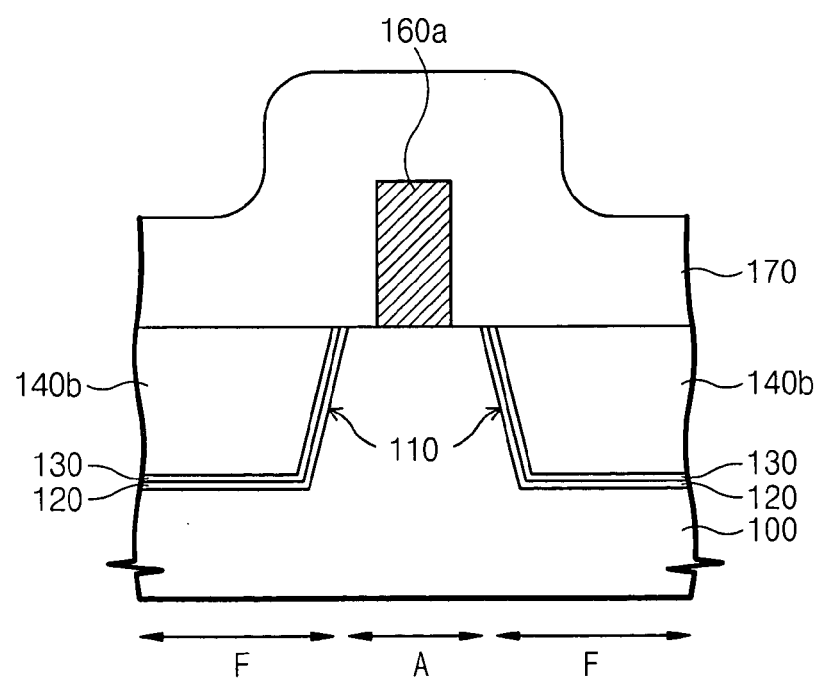
Figure 7:
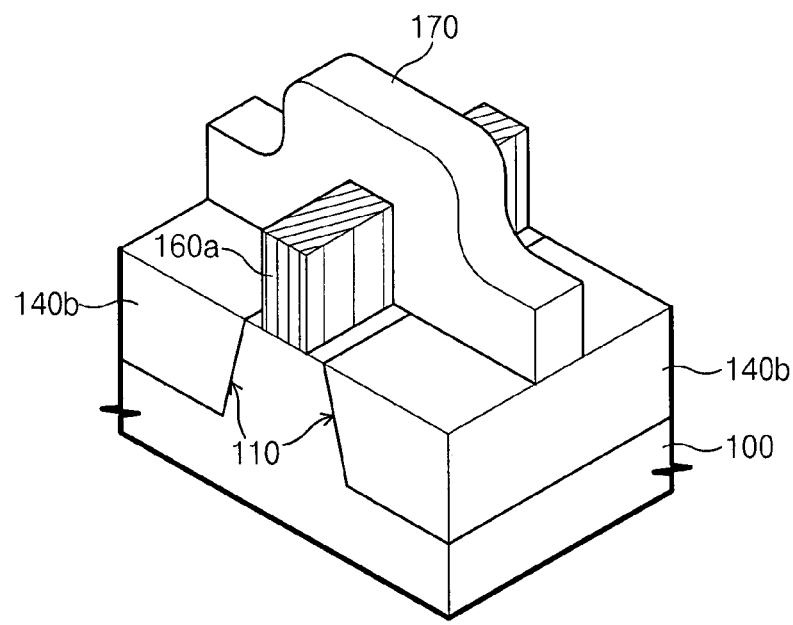
FIG. 7 is a perspective view illustrating a fin field effect transistor according to various embodiments of the present invention.

Referring to FIG. 6, a conductive layer 170, such as a polysilicon layer, is formed on the silicon substrate 100 and the epitaxial fin 160a. The conductive layer 170 may be formed directly on the substrate 100 and fin 160a. Also, the conductive layer 170 may be formed on a majority of the sidewalls of the fin 160a, and/or may substantially cover the sidewalls of the fin 160a. The scaled-down in situ doped silicon epitaxial fin 160a and the conductive layer 170 may serve as a channel and a gate electrode, respectively, for a field effect transistor.

Although not shown in FIG. 6, a gate oxide layer may be formed by oxide deposition on the channel (epitaxial fin 160a) prior to formation of the gate electrode (conductive layer 170). Also, a source and a drain may be formed according to processes well known in the art to complete a fin field effect transistor.

Referring to FIG. 7, the above-mentioned processes provide a fin or silicon epitaxial layer 160a which may serve a channel for a field effect transistor. The silicon epitaxial fin 160a may be homogenously doped with an impurity concentration in the range of about $1.0 \times 10^{17}$ to about $1.0 \times 10^{19}$ ions/cm$^3$, so that the threshold voltage may be increased above 1 V. Also, off-state leakage current may be lowered below 1 fA/cell. Further, as the silicon epitaxial fin 160a is doped in situ, the doping distribution may be more homogenous than that of ion implantation. Thus, variations in threshold voltage may also be reduced.

Some embodiments according to the present invention may be applicable to dynamic random-access memory (DRAM), which may require a threshold voltage over 1 V, off-state leakage current below 1 fA/cell, and a reduced or eliminated subthreshold swing.

Fin field effect transistors and fabrication methods thereof according to some other embodiments of the present invention are explained in detail hereinafter.

FIG. 8–FIG. 13 are cross-sectional views illustrating methods of fabricating fin field transistors according to some other embodiments of the present invention. FIG. 14 is a perspective view illustrating a fin field effect transistor according to some other embodiments of the present invention.

Figure 8:
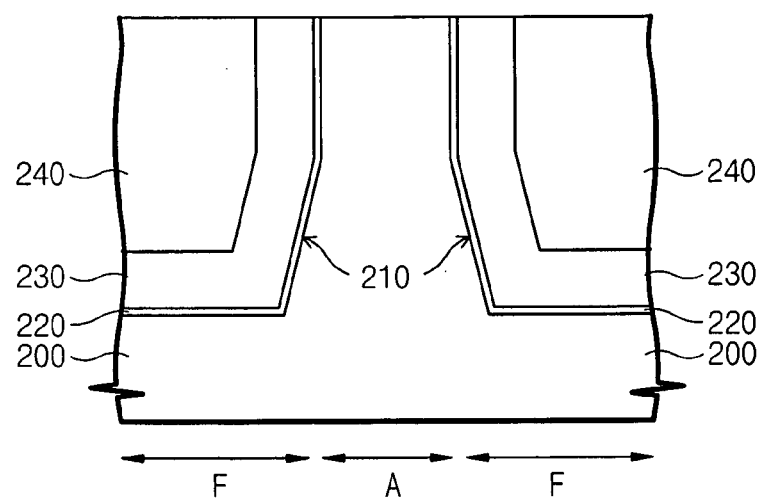
FIG. 8–FIG. 13 are cross-sectional views illustrating methods of fabricating fin field effect transistors according to some other embodiments of the present invention.

Referring to FIG. 8, a silicon substrate 200 is provided and a trench 210 is formed in the silicon substrate 200. A sidewall oxide layer 220 and a nitride liner 230 are then sequentially formed in the trench 210. The trench 210 is filled with an insulation material to form an isolation layer 240 and to define a field region F. As such, the silicon substrate 200 is divided into an active region A (where a transistor may be formed) and a field region F (filled by the isolation layer 140) which may electrically insulate one active region from another. In the embodiment of FIG. 8, the nitride layer 230 is formed to a thickness of about 400 Å to about 600 Å.

Figure 9:
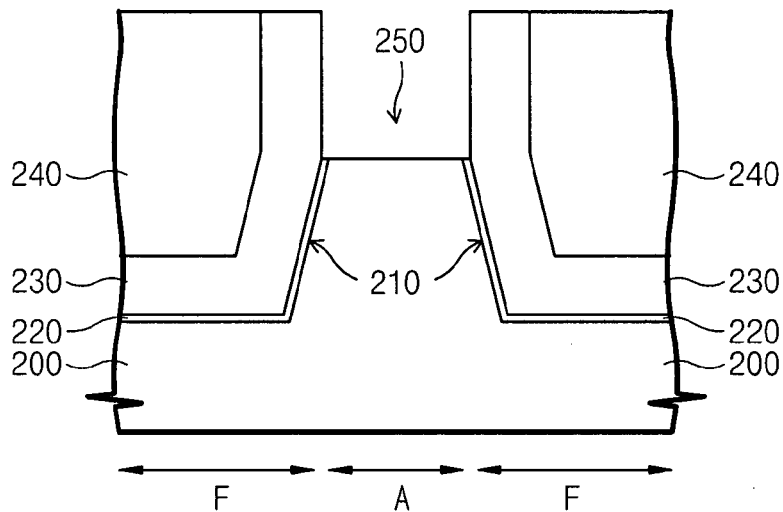

Referring to FIG. 9, the active region A is recessed by means of CDE, forming a cavity 250 surrounded by the isolation layer 240. The sidewall oxide layer 220 in the trench 210 is then removed by an oxide-removing process.

Figure 10:
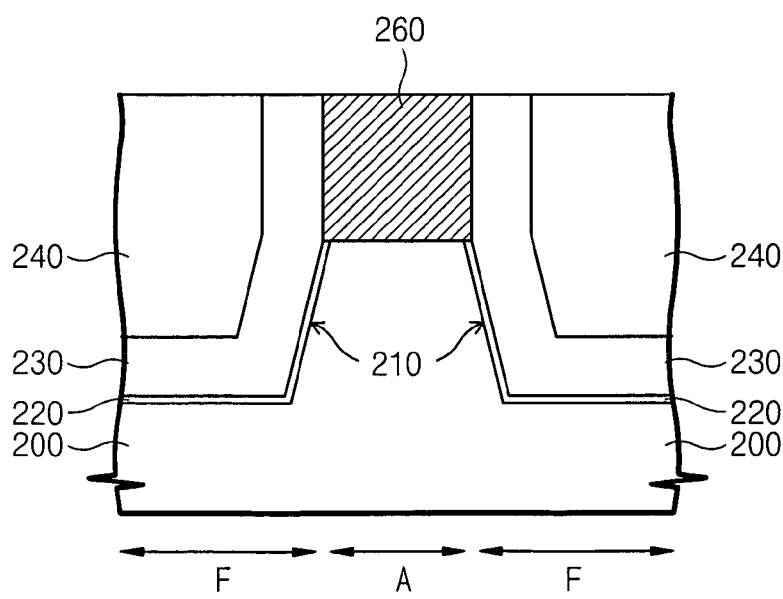

Referring to FIG. 10, an in situ doped silicon epitaxial layer 260 is selectively formed in the cavity 250 on active region A using a SEG process. The SEG process may use Ultra High Vacuum Chemical Vapor Deposition (UH-VCVD) or Low Pressure Chemical Vapor Deposition (LPCVD). The SEG process may employ at least a silicon source gas, an impurity gas, and a selectivity gas. The silicon source gas may be $SiH_2Cl_2$, $Si_4H_6$, and $SiH_4$. The impurity gas may be $PH_3$ or $B_2H_6$. The selectivity gas may be HCl or $Cl_2$.

Figure 11:
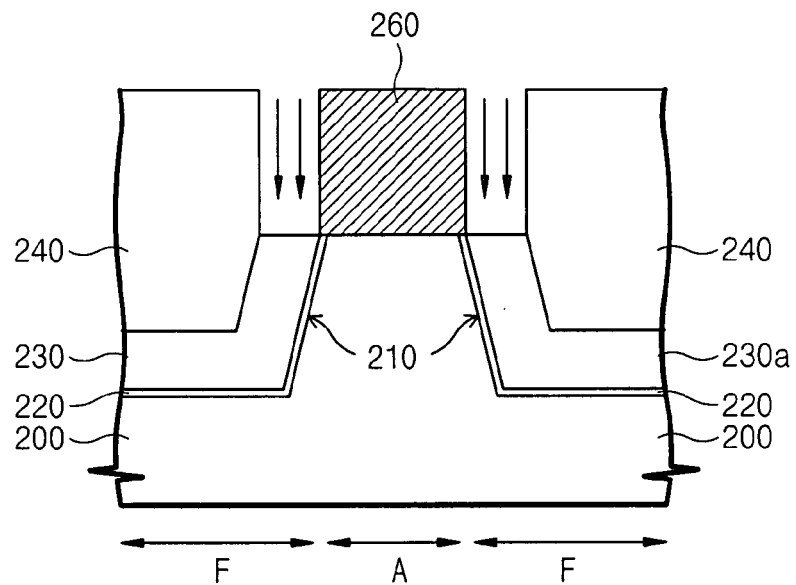

Referring to FIG. 11, a portion of the nitride liner 230 in the trench 210 is removed to form a recessed nitride liner 230a. It may be preferable that wet etching using $P_2O_5$ (which has high selectivity between the silicon epitaxial layer 260 and the isolation layer 240) be used to remove the nitride liner 230. The isolation layer 240 is not recessed by this process.

Figure 12:
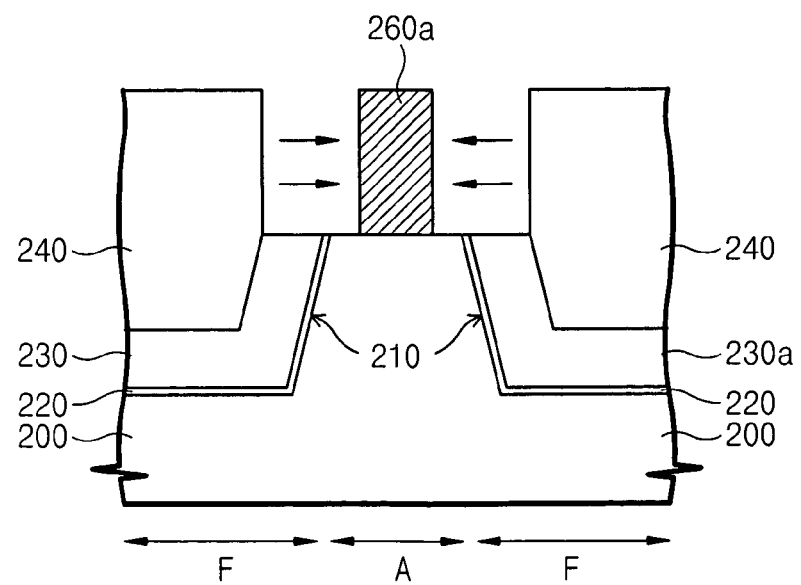

Referring to FIG. 12, the in situ doped silicon epitaxial layer 260 is "trimmed" to form a scaled-down in situ doped silicon epitaxial fin 260a having a width, for example, of about 300 Å to about 500 Å. The trimming process may enable removal of stacking faults, and may enable formation of a narrower silicon epitaxial fin 260a than is possible with other known techniques, such as photolithography.

Figure 13:
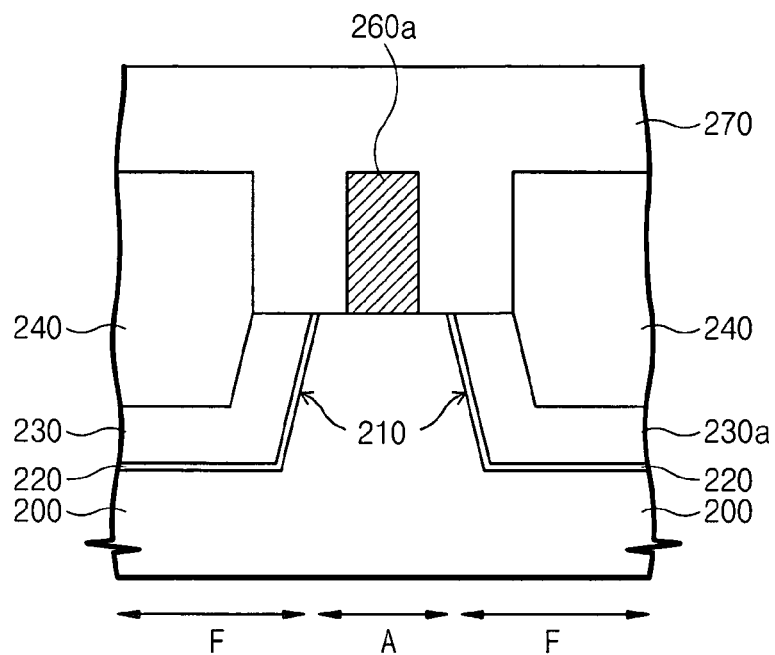
Figure 14:
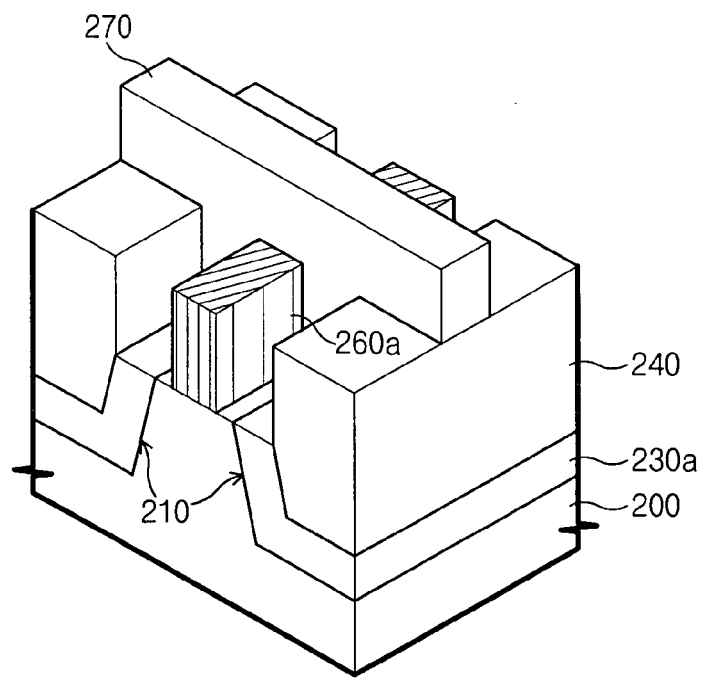
FIG. 14 is a perspective view illustrating a fin field effect transistor according to some other embodiments of the present invention.

Referring to FIG. 13, a conductive layer 270, such as a polysilicon layer, is formed on the silicon substrate 200, the isolation layer 240, and the scaled-down in situ doped silicon epitaxial fin 260a. The conductive layer 270 may be formed directly on the substrate 200, isolation layer 240, and fin 260a. Also, the conductive layer 270 may be formed on the recessed nitride liner 230a, such that it covers a majority of the sidewalls of the fin 260a and/or substantially covers the sidewalls of the fin 260a. The isolation layer 240 may protrude above the surface of the substrate 200 to a height about the same as the height of the fin 260a. As such, the surface of the conductive layer 270 may be evenly formed since the isolation layer 240 is not recessed, even though the nitride liner 230a is recessed. The scaled-down in situ doped silicon epitaxial fin 260a and the conductive layer 270 may serve as a channel and a gate electrode, respectively, for a field effect transistor.

Although not shown in FIG. 13, a gate oxide layer may be formed by oxide deposition on the channel (epitaxial fin 260a) prior to formation of the gate electrode (conductive layer 270). Also, a source and a drain may be formed according to processes well known in the art to complete a fin field effect transistor.

Referring to FIG. 14, the above-mentioned processes provide a silicon epitaxial fin 260a that is homogenously doped and serves a channel for a field effect transistor. The silicon epitaxial fin 260a may be doped with an impurity concentration in the range of about $1.0 \times 10^{17}$ to about $1.0 \times 10^{19}$ ions/cm$^3$, so that the threshold voltage may be increased above 1 V. Also, off-state leakage current may be lowered below 1 fA/cell. Further, as the silicon epitaxial fin 260a is doped in situ, the doping distribution may be more homogenous than that of ion implantation. Thus, variations in threshold voltage may also be reduced.

Many alterations and modifications may be made by those having ordinary skill in the art, given the benefit of present disclosure, without departing from the spirit and scope of the invention. Therefore, it must be understood that the illustrated embodiments have been set forth only for the purposes of example, and that it should not be taken as limiting the invention as defined by the following claims. The following claims are, therefore, to be read to include not only the combination of elements which are literally set forth but all equivalent elements for performing substantially the same function in substantially the same way to obtain substantially the same result. The claims are thus to be understood to include what is specifically illustrated and described above, what is conceptually equivalent, and also what incorporates the essential idea of the invention.

What is claimed is:

1. A method of forming a fin field effect transistor on a semiconductor substrate, comprising:
    forming an active region in the substrate;
    forming an epitaxial layer directly on the active region;
    oxidizing a surface of the epitaxial layer;
    removing the oxidized surface of the epitaxial layer to form a vertical fin on the active region and to decrease a width of the fin so that the width of the fin is narrower than a width of the active region; and
    forming a conductive layer on a top surface and on sidewalls of the fin.

2. The method of claim 1, wherein forming a conductive layer comprises forming a conductive layer on a majority of the sidewalls of the fin.

3. The method of claim 1, wherein forming a conductive layer comprises forming a conductive layer substantially covering the sidewalls of the fin.

4. The method of claim 1, wherein removing the oxidized surface comprises etching the oxidized surface using hydrogen fluoride (HF).

5. The method of claim 1, further comprising doping the epitaxial layer in situ before removing the oxidized surface of the epitaxial layer.

6. The method of claim 5, wherein doping the epitaxial layer further comprises homogenously doping the epitaxial layer with boron or phosphorous.

7. The method of claim 5, wherein doping the epitaxial layer comprises homogeneously doping the epitaxial layer to a concentration of about $1.0 \times 10^{17}$ to about $1.0 \times 10^{19}$ ions/cm$^3$.

8. The method of claim 1, wherein forming the epitaxial layer comprises forming the epitaxial layer using one of Ultra High Vacuum Chemical Vapor Deposition and Low Pressure Chemical Vapor Deposition.

9. The method of claim 1, wherein forming the epitaxial layer comprises forming the epitaxial layer using at least one of a silicon source gas, a selectivity gas, and/or an impurity gas.

10. The method of claim 9, wherein the silicon source gas is one of SiH2Cl2, Si2H6, and SiH4.

11. The method of claim 9, wherein the selectivity gas is one of HCl and Cl2.

12. The method of claim 9, wherein the impurity gas is one of B2H6 and PH3.

13. A method of forming a fin field effect transistor on a semiconductor substrate, comprising:
    forming a trench in the substrate;
    forming an oxide layer on a bottom surface and on sidewalls of the trench;
    forming a nitride liner on a bottom surface and on sidewalls of the trench;
    forming an isolation layer in the trench to define an active region adjacent the trench;
    forming an epitaxial layer on the active region;
    removing a portion of the epitaxial layer to form a vertical fin on the active region, the fin having a width narrower than a width of the active region; and
    forming a conductive layer on a top surface and on sidewalls of the fin.

14. The method of claim 13, further comprising recessing the active region before forming the epitaxial layer.

15. The method of claim 13, further comprising recessing a portion of the active region and the oxide layer.

16. The method of claim 14, further comprising recessing the isolation layer after forming the epitaxial layer.

17. The method of claim 16, wherein recessing the isolation layer comprises selectively etching the isolation layer using HF.

18. The method of claim 14, further comprising recessing the nitride liner to a level below the isolation layer after forming the epitaxial layer.

19. The method of claim 18, wherein recessing the nitride liner comprises selectively etching the nitride liner using $P_2O_5$.

20. The method of claim 14, wherein recessing the active region comprises recessing the active region using one of chemical dry etching and thermal desorption silicon etching.

21. The method of claim 20, wherein the chemical dry etching uses one of CF4 gas and CF4 included gas, and wherein the thermal desorption silicon etching uses Cl2 gas.

22. The method of claim 1, wherein the fin has a width of about 300 Å to about 500 Å, and wherein the fin has a height of about 800 Å to about 1000 Å.

23. The method of claim 13, wherein the nitride liner has a thickness of about 50 Å to about 100 Å.

24. The method of claim 13, wherein the nitride liner has a thickness of about 400 Å to about 600 Å.

* * * * *